United States Patent [19]
Sato

[11] Patent Number: 6,088,374
[45] Date of Patent: Jul. 11, 2000

[54] MULTI-WAVELENGTH SEMICONDUCTOR LASER ARRAY HAVING PHASE-SHIFT STRUCTURES

[75] Inventor: Kenji Sato, Tokyo, Japan

[73] Assignee: NEC Corporation, Tokyo, Japan

[21] Appl. No.: 09/060,296

[22] Filed: Apr. 15, 1998

[30] Foreign Application Priority Data

Apr. 15, 1997 [JP] Japan .................................... 9-097201

[51] Int. Cl.[7] .............................. H01S 3/10; H01S 3/19; H01S 3/08
[52] U.S. Cl. .................................. 372/23; 372/50; 372/96
[58] Field of Search .................... 372/23, 50, 96

[56] References Cited

U.S. PATENT DOCUMENTS

| 5,065,406 | 11/1991 | Kinoshita ................................ 372/96 |
| 5,953,359 | 9/1999 | Yamaguchi et al. ...................... 372/50 |

FOREIGN PATENT DOCUMENTS

| 62-109388 | 5/1987 | Japan . |
| 63-269592 | 11/1988 | Japan . |
| 2-110986 | 4/1990 | Japan . |
| 2-310986 | 12/1990 | Japan . |
| 3-185781 | 8/1991 | Japan . |
| 7-335971 | 12/1995 | Japan . |

OTHER PUBLICATIONS

J.E.A. Whiteaway, et al., "The Static and Dynamic Characteristics of Single and Multiple Phase–Shifted DFB Laser Structures", *IEEE Journal of Quantum Electronics*, vol. 28, No. 5, pp. 7–23, May 1992.

Primary Examiner—Teresa M. Arroyo
Assistant Examiner—Quyen P. Leung
Attorney, Agent, or Firm—Foley & Lardner

[57] ABSTRACT

A multi-wavelength distributed feedback (DFB) semiconductor laser array is herein disclosed which comprises a plurality of DFB semiconductor laser elements, wherein a grating periodicity is set equal for all the laser elements and, at a plurality of positions in the cavity of each laser element, phase-shift structures of the grating, magnitudes of which are set independently, are placed, whereby an oscillation wavelength of each laser element can be set independently. According to the present invention, a plurality of semiconductor lasers, capable of a stable wavelength operation at the time of semiconductor laser modulation and having a respective, independently-settable oscillation wavelength, can be arranged on one single semiconductor substrate. The present invention further provides a method for time for the gratings, reduces a production cost and is apt for mass production.

6 Claims, 8 Drawing Sheets

MULTI-WAVELENGTH SEMICONDUCTOR LASER ARRAY HAVING PHASE-SHIFT STRUCTURES

BACKGROUND OF THE INVENTION

1. Field of the Invention

The present invention relates to a semiconductor laser array and more particularly to a phase-shifted multi-wavelength distributed feedback (DFB) semiconductor laser array for use in the multiple wavelength optical communication system.

2. Description of the Prior Art

Figure 8:
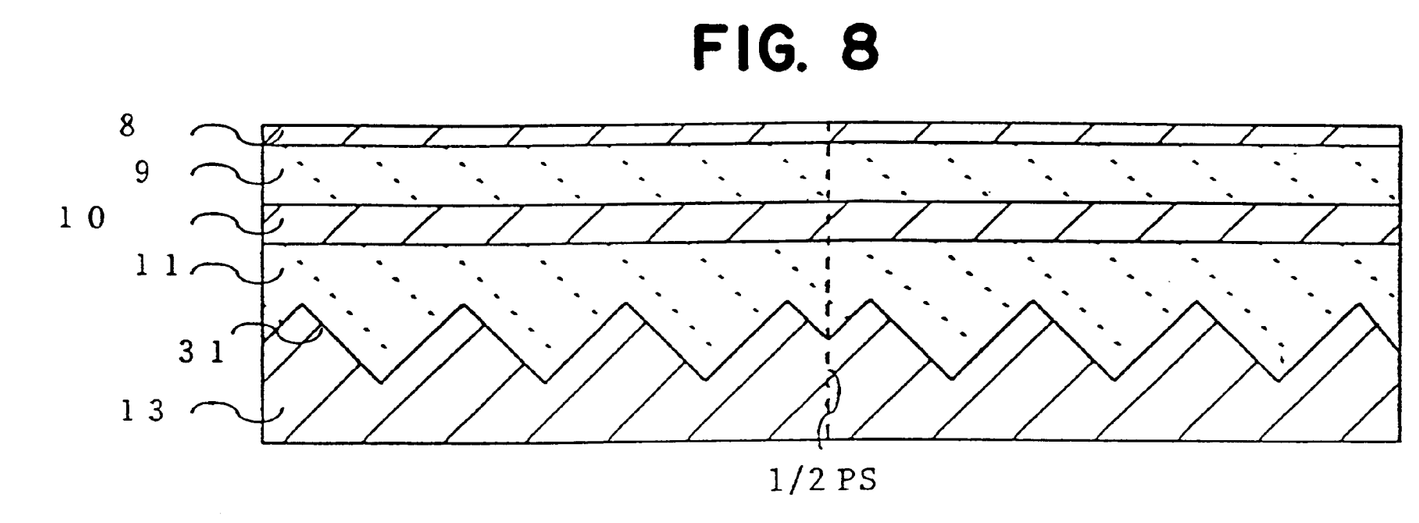
FIG. 8 is a schematic view representing the structure of the conventional λ/4 phase-shifted DFB semiconductor laser.

A semiconductor laser utilized in the conventional multi-wavelength semiconductor laser array for use in the multi-channel optical communication system is called as a λ/4 phase-shifted DFB semiconductor laser and high in a single-mode quality, wherein the phase of a diffraction grating is shifted by a half period at the center of a laser resonance cavity, as illustrated in a cross-sectional view of FIG. 8. The λ/4 phase-shift structure is a known structure and is disclosed, for example, in "Semiconductor Laser", Japan Society of Applied Physics (ed.), Ohmsha Ltd., 1994, p. 272, FIG. 12—12. This structure is characterized by a capability to have a high side mode suppression ratio, since the laser oscillation wavelength therein is equal to the Bragg wavelength determined by the periodicity of grating thereof.

Further, in Japanese Patent Application Laid-open No. 109388/1987, a multi-wavelength laser array structure is described, in which a plurality of semiconductor lasers with each own grating periodicity are arranged in parallel. In this structure, each laser, having an individual electrode, is driven to emit a separate oscillation wavelength so that the laser array, as a whole, can be operated as a multi-wavelength semiconductor laser array.

However, in such a semiconductor laser array structure, the grating periodicity in each semiconductor laser is required to be formed to differ from each other so as to operate as a multi-wavelength laser array. In case that gratings are fabricated by electron beam exposure method using electron beam exposure apparatus, the individual grating periodicity must be set up with each laser and the grating are scribed one by one. It takes a longer time to form patterns of grating than in holographic exposure method. This causes a problem that this method is less suitable for mass production because of its too time-consuming exposure step.

Further, there is the second problem that, because a λ/4 phase-shift structure is located at the center of the laser cavity in the conventional λ/4 phase-shifted DFB semiconductor lasers, photons accumulate in the phase-shifted regions. This gives rise to a extremely non-uniform intensity distribution of the internal electric field and, consequently, a large disparity in the refractive index change over locations along the cavity caused by carrier movements, and thereby resulting in a severe fluctuation of the wavelength at the time of modulation.

SUMMARY OF THE INVENTION

In light of the above problems, an object of the present invention is to provide a multi-wavelength DFB semiconductor laser array, equipped with a plurality of semiconductor lasers on one single substrate, each of which is independently designed to have a separate oscillation wavelength, and capable of a stable wavelength operation at the time of semiconductor laser modulation.

A further object of the present invention is to provide a multi-wavelength DFB semiconductor laser array having a shortened fabrication time for the grating equipped in each laser element and reduced production cost, in comparison with the heretofore available, and being apt for mass production, as well as a method for manufacturing thereof.

The present invention relates to a multi-wavelength DFB semiconductor laser array comprising a plurality of DFB semiconductor laser elements arranged side by side on a semiconductor substrate, wherein: a grating periodicity is set equal for all of the laser elements; and phase-shift structures of the grating are placed at a plurality of positions in the cavity of each laser element, the magnitudes of the phase-shift being set independently, whereby an oscillation wavelength of each laser element is set independently.

It is preferred that the phase-shift structures contained in each laser element are placed at positions dividing equally the whole length of the cavity and have the magnitudes of the phase shifts with the same absolute value therein.

It is preferred that the magnitudes of the phase-shifts are either ¼ or −¼ of a period of the grating.

Such a multi-wavelength DFB semiconductor laser array can be manufactured in a method comprising steps of:

coating a semiconductor substrate with a first photoresist which is to serve to form a grating;

coating this first photoresist with a second photoresist which differs from the first photoresist;

coating this second photoresist further with a third photoresist which differs from both the first and the second photoresists;

patterning this third photoresist to form a predetermined shape by a lithography;

patterning by a lithography portions of the second photoresist layer appeared to the surface after the removal of the portions of the third photoresist layer, and thereby leaving two-tier structure made out of two layers of the second and the third photoresist;

exposing a grating pattern on the whole surface of the first photoresist layer by a interference exposure method, with the second and the third photoresists which are treated in the above process serving as phase masks;

developing the first photoresists, after the removal of the second and the third photoresists, so as to form a grating pattern thereof; and etching the semiconductor substrate, using this grating pattern of the first photoresist as a mask, to fabricate a grating with the predetermined phase-shift structures being placed at the predetermined positions.

BRIEF DESCRIPTION OF THE DRAWINGS

FIGS. 6(1)–6(8) are schematic diagrams illustrating the manufacturing method of the third embodiment.

EXPLANATION OF SYMBOLS

1 . . . Multi-wavelength semiconductor laser array
2 . . . First laser
3 . . . Second laser
4 . . . Third laser
5 . . . Fourth laser
6 . . . Fifth laser
7 . . . Sixth laser
8 . . . Cap layer
9 . . . The second clad layer
10 . . . Active layer
11 . . . The first clad layer
12 . . . Diffraction grating
13 . . . Semiconductor substrate
14 . . . Multi-wavelength semiconductor laser array
15 . . . First laser
16 . . . Second laser
17 . . . Third laser
18 . . . Fourth laser
19 . . . Fifth laser
20 . . . Sixth laser
21 . . . Diffraction grating
22 . . . Multi-wavelength semiconductor laser array
23 . . . First laser
24 . . . Second laser
25 . . . Third laser
26 . . . Fourth laser
27 . . . First photoresist
28 . . . Second photoresist
29 . . . Third photoresist
30 . . . Diffraction grating
31 . . . Diffraction grating
PS . . . period of phase-shift

DETAILED DESCRIPTION OF THE INVENTION

The present invention solves the foregoing problems by means described below.

A λ/4 phase-shifted DFB semiconductor laser has been known to oscillate, in a single mode, at the Bragg wavelength which is determined by the periodicity of grating therein. In such a λ/4 phase-shift structure as schematically shown in FIG. 8, the phase of grating is shifted by a half period at the center of the laser cavity and thereby the condition for laser oscillation is satisfied at the Bragg wavelength. In case the magnitude of the phase shift, is changed from a half period, the oscillation wavelength of the laser slightly deviates from the Bragg wavelength.

However, in the conventional λ/4 phase-shifted DFB semiconductor laser, the arrangement that the phase shift structure is placed only at the center of the laser cavity leads to a concentration of the photon density in the phase-shift region and, as a consequence, a non-uniform internal photon density and thereby brings about a problem of unstable oscillation wavelengths at the time of modulation.

The present invention solves the above-mentioned problem by allocating a plurality of phase-shift structures along the grating and thereby preventing a concentration of photon density all one point. The number of phase-shift structures set in the laser cavity is equal to or more than two, preferably equal to or more than three and, in general, about equal to or less than ten.

Further, it is particularly preferred to set the phase-shift structures approximately equispaced from each other along the grating in the laser cavity, since this arrangement enables to make the emission threshold for each laser nearly equal.

Further, with respect to a semiconductor laser element in which a plurality of the phase-shift structures are placed in the laser cavity and which is comprising a semiconductor laser array, it is possible to obtain a plurality of semiconductor laser elements with the same periodicity of the grating but with the different oscillation wavelength by setting separate magnitudes of the phase-shifts thereof.

Further, the oscillation wavelength emitted from each semiconductor laser can be arranged to be equispaced in terms of the wavelength from each other by setting appropriate magnitudes for the phase shifts independently.

Further, it is possible to design an oscillation wavelength of each laser element, using magnitudes of the phase-shifts with only one absolute value but combining with either a positive sign or a negative sign, whereupon the number of fabrication processes thereof can be reduced.

The present invention facilitates mass production of multi-wavelength semiconductor laser arrays, since the grating of each semiconductor laser is fabricated by an interference exposure method.

Therefore, in accordance with the present invention, the multi-wavelength semiconductor laser array having a series of oscillation wavelengths with an equal difference can be attained, despite of the identical periodicity of all of the gratings in the semiconductor laser array, and moreover, owing to the existence of a plurality of phase-shift structures, the distribution of electric field inside of the laser cavity can be flattened and, consequently, fluctuations of the wavelength at the time of modulation can be reduced.

EXAMPLE 1

Figure 1A:
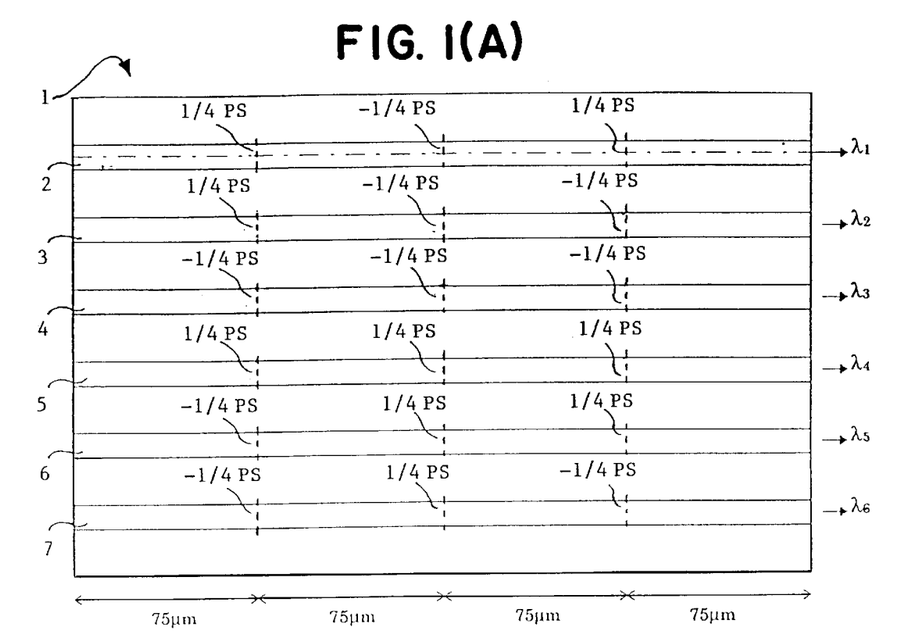
FIG. 1(A) is a plan view of a six-wavelength semiconductor laser array of the first embodiment.
Figure 1B:
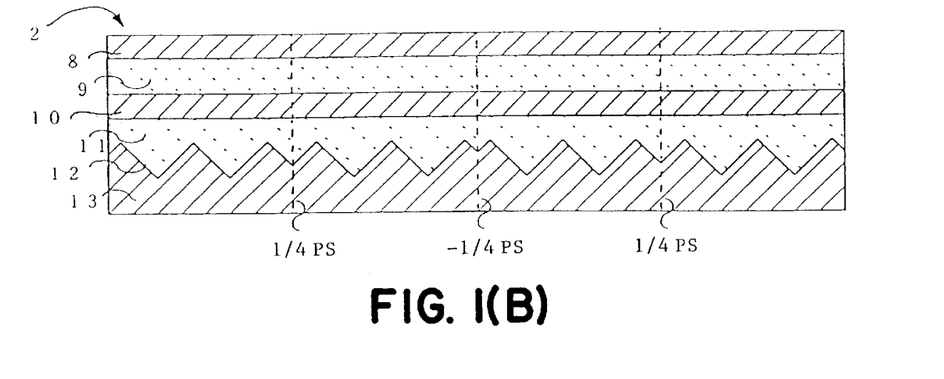
FIG. 1(B) is a cross-sectional view of the first semiconductor laser element therein.

FIG. 1 is a view of structure of a six-wavelength semiconductor laser array, showing the first embodiment of the present invention.

In this semiconductor laser array 1, semiconductor lasers are arranged parallel to the length of the laser cavity, as shown in FIG. 1(A), wherein a grating in each semiconductor laser is fabricated to have the equal periodicity. FIG. 1(B) is a cross-sectional view of the first laser 2, which is a multiple phase-shifted DFB semiconductor laser. All other lasers are fabricated to the same, apart from phase-shift structures thereof.

This structure can be fabricated by a known method of epitaxial growth, a known method of electron beam exposure and a known method of lithography, and allows an individual injection of drive current into each semiconductor laser.

In a laser array device 1, as shown in FIG. 1(A), phase-shift structures are formed at three positions in a grating of a 300 μm cavity in each semiconductor laser. The phase-shift structures at three positions are either a λ/8 phase shift or a −λ/8 phase shift, corresponding to a phase shift of a ¼ period or −¼ period in terms of grating period, that is a half of the usual magnitude for λ/4 phase-shift structures. Further, the phase-shift structures are placed at the center of the cavity and at each position of the two midpoints between the center and an end of the cavity. There are eight possible combinations of phase-shift structures at three positions, taken from phase-shifts of a ¼ period and a −¼ period, but an elimination of the duplicates whose structure become the same to another by turning from side to side leaves six combinations.

The first to the sixth semiconductor lasers are fabricated to have one of these six combinations, in a similar structure to that shown in FIG. 1(B).

With regard to the six combinations of phase-shift structures, as shown in FIG. 1(A), the first laser 2 has a ¼, a −¼ and a ¼ period of phase-shift, the second laser 3 has a ¼, a −¼ and a −¼ period of phase-shift, the third laser 4 has a −¼, a −¼ and a −¼ period of phase-shift, the fourth laser 5 has a ¼, a ¼ and a ¼ period of phase-shift, the fifth laser 6 has a −¼, a ¼ and a ¼ period of phase-shift and the sixth laser 7 has a −¼, a ¼ and a −¼ period of phase-shift, in terms of grating period.

Further, on both ends of all of these six semiconductor lasers 2–7, anti-reflection coating is applied.

Figure 2:
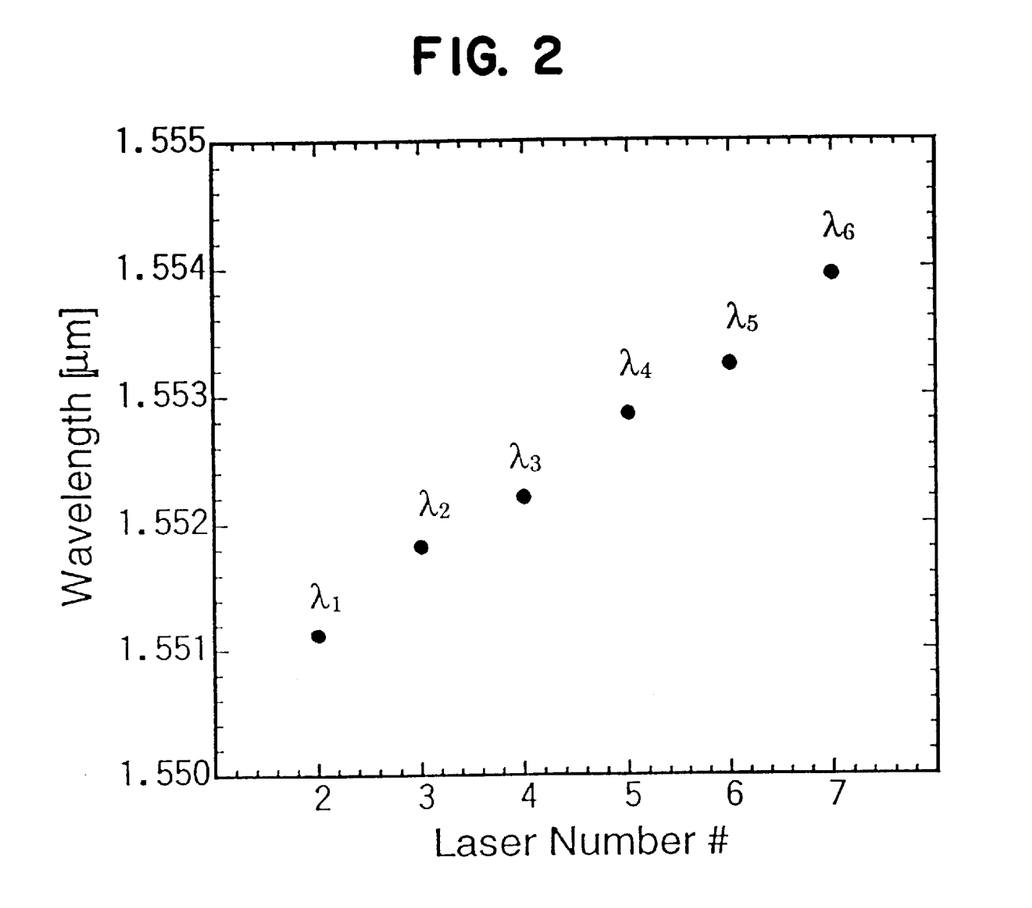
FIG. 2 is a diagram showing the oscillation wavelengths of the six-wavelength semiconductor laser array of the first embodiment.

FIG. 2 is a diagram showing the oscillation wavelengths of the six-wavelength semiconductor laser array 1 which is the first embodiment of the present invention. It should be noted that although the grating periodicity in each semiconductor laser is all the same, different oscillation wavelength is obtained for each, resulting from having different phase-shift regions in each laser. Hereupon the difference of wavelengths between two neighbouring semiconductor lasers are not equal but 0.56 nm on the average.

While this embodiment is realized in the form of the six-wavelength semiconductor laser array by setting the phase-shift structures at three positions, the number of phase shifts is not limited by this and may be any larger number. Moreover, the number of lasers emitting individual wavelength may be altered, as well.

Further, in this embodiment, a distribution feedback coupling constant κ L is set equal to 3. But this should not be limited to 3, and generally 2 to 4 is preferred. Setting the coupling constant κ L large widens a range of oscillation wavelengths obtained from a semiconductor laser array.

EXAMPLE 2

Next, referring to the drawings, the second embodiment of the present invention will be described in detail.

Figure 3A:
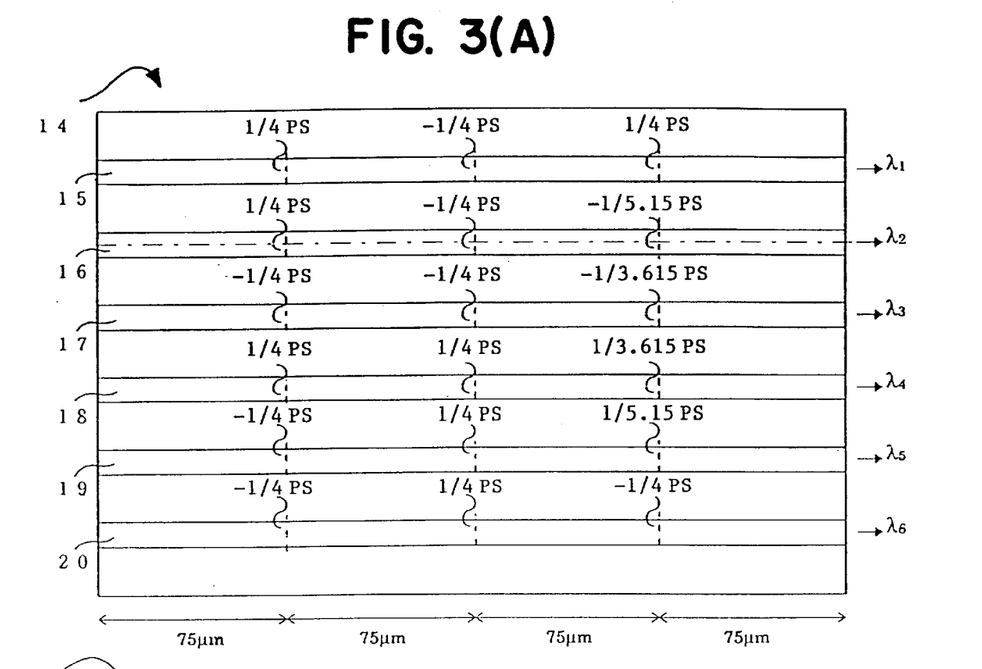
FIG. 3(A) is a plan view of a six-wavelength semiconductor laser array of the second embodiment.
Figure 3B:
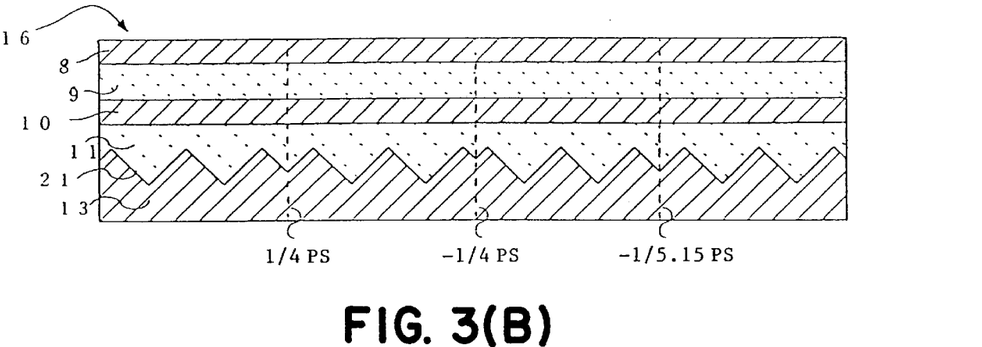
FIG. 3(B) is a cross-sectional view of the second semiconductor laser element therein.

In a laser 16, a cross-sectional view of which is shown in FIG. 3(B), phase-shift structures are formed at three positions in a grating of a 300 μm cavity, as in the first embodiment of the present invention. With regard to the phase-shift structures at three positions in a semiconductor laser array 14 which is the second embodiment of the present invention, as shown in FIG. 3(A), the first laser 15 has a ¼, a −¼ and a ¼ period of phase-shift, the second laser 16 has a ¼, a −¼ and a −⅕.15 period of phase-shift, the third laser 17 has a −¼, a −¼ and a −⅓.615 period of phase-shift, the fourth laser 18 has a ¼, a ¼ and a ⅓.615 period of phase-shift, the fifth laser 19 has a −¼, a ¼ and a ⅕.15 period of phase-shift and the sixth laser 20 has a −¼, a ¼ and a −¼ period of phase-shift, in terms of grating period.

Further, six semiconductor lasers 15–20 in the second examples of the present invention, all have the both ends applied anti-reflection coating.

Figure 4:
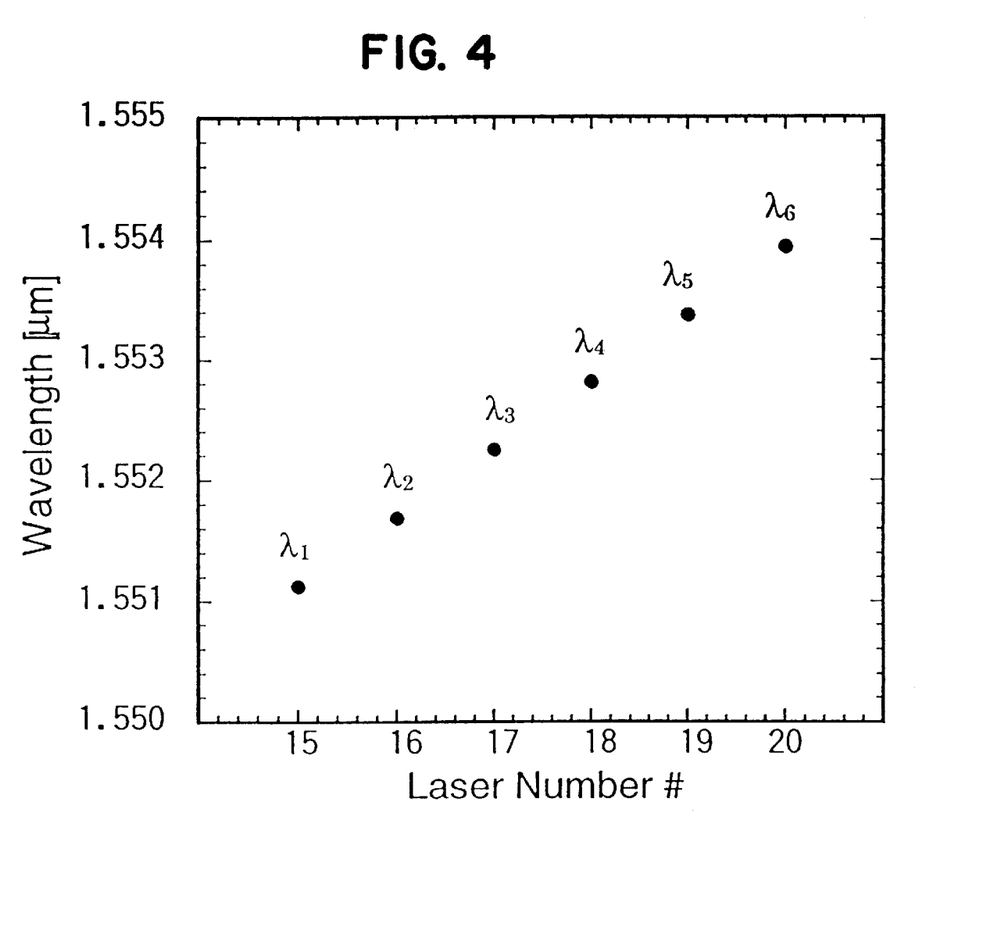
FIG. 4 is a diagram showing the oscillation wavelengths of the six-wavelength semiconductor laser array of the second embodiment.

FIG. 4 is a diagram showing the oscillation wavelengths of the six-wavelength semiconductor laser array 14 which is the second embodiment of the present invention. It should be noted that although the grating periodicity in each semiconductor laser is all the same, different oscillation wavelength is obtained for each, resulting from having different phase-shift regions in each laser. Hereupon the difference of wavelengths between two neighbouring semiconductor lasers are equal and 0.56 nm.

While this embodiment is realized in the form of the six-wavelength semiconductor laser array by setting the phase-shift structures at three positions, the number of phase shifts is not limited by this and may be any larger number. Moreover, the number of lasers emitting individual wavelength may be altered as well.

Further, in this embodiment, a distribution feedback coupling constant κ L is set equal to 3. But this should not be limited to 3, and generally 2 to 4 is preferred. Setting the coupling constant κ L large widens a range of oscillation wavelengths obtained from a semiconductor laser array.

EXAMPLE 3

Next, referring to the drawings, the third embodiment of the present invention will be described in detail.

Figure 5:
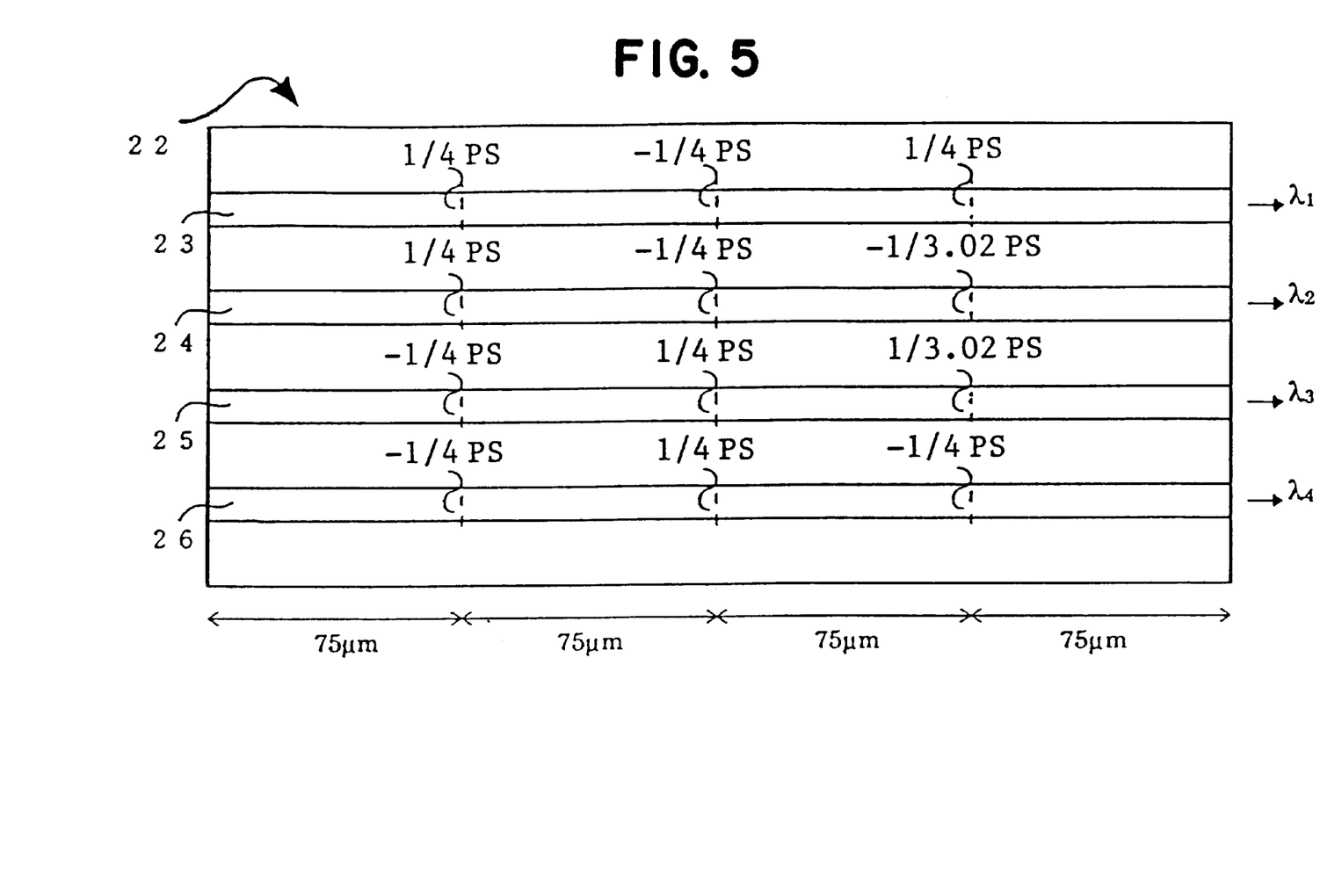
FIG. 5 is a plan view of a four-wavelength semiconductor laser array of the third embodiment.
Figure 6:
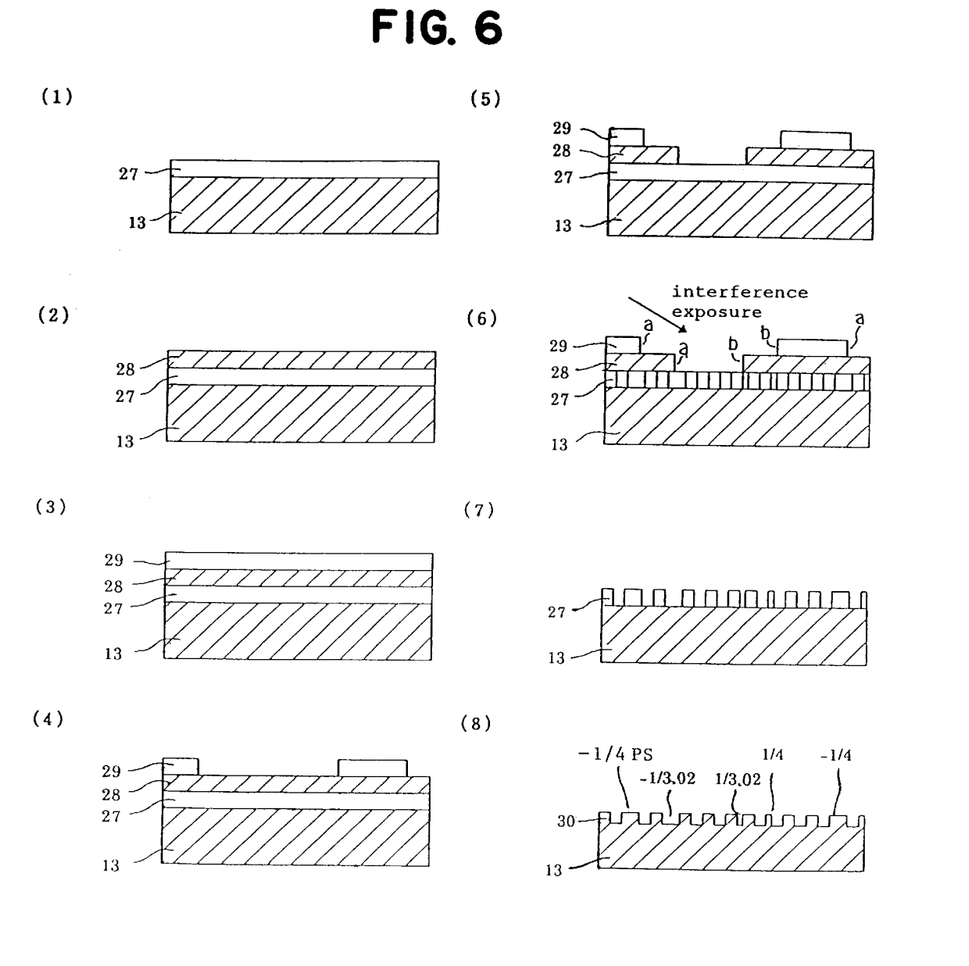

A semiconductor laser array 22, as shown in FIG. 5, is an array comprising four semiconductor lasers in each of which phase-shift structures are formed at three positions in a grating of a 300 μm cavity as in the first and the second embodiments of the present invention. With regard to the phase-shift structures at three positions, as shown in FIG. 5, the first laser 23 has a ¼, a −¼ and a ¼ period of phase-shift the second laser 24 has a ¼, a −¼ and a −⅓.02 period of phase-shift, the third laser 25 has a −¼ a ¼ and a ⅓.02 period of phase-shift and the fourth laser 26 has a −¼, a ¼ and a −¼ period of phase-shift, in terms of grating period.

Next, referring to FIG. 6, a method for manufacturing the laser array of the present invention will be described.

First, as illustrated in FIG. 6(1), a semiconductor substrate 13 is coated with a first photoresist 27 for high resolution use with thickness of 0.1 μm, which is to serve to form a grating, and baked at 90° C.

Next, as illustrated in FIG. 6(2), the first photoresist 27 is coated with a second photoresist 28 and baked at 90° C.

Next, as illustrated in FIG. 6(3), the second photoresist 28 is coated further with a third photoresist 29 and baked at 90° C. The thickness of both films of the second photoresist 28 and the third photoresist 29 is determined so as to achieve the desired magnitudes of phase shifts, according to Snell's law.

Next, as illustrated in FIG. 6(4), a pattern exposure is performed by a mercury lamp using a photomask in such a manner that only the third photoresist 29 is patterned, wherein the third photoresist 29 is more light-sensitive than the second photoresist 28 so that it can be accomplished to pattern only the third photoresist 29 but not the second photoresist 28.

Next, as illustrated in FIG. 6(5), portions of the surface of the second photoresist 28 reappeared after the partial removal of the third photoresist 29 are exposed by a mercury lamp using a photomask. The exposure time thereof is longer than that in a process illustrated in FIG. 6(4), in accordance with respective sensitivities of photoresists, and hereby patterning the second photoresist 28 is carried out. This results in the formation of a two-tier structure made out of two layers of the second photoresist 28 and the third photoresist 29, as illustrated in FIG. 6(5).

Next, as illustrated in FIG. 6(6), a grating pattern is exposed on the whole surface of the first photoresist 27, using the second photoresist 28 and the third photoresist 29 as phase masks, by a known method of interference exposure, which may be described, for example, in "Semiconductor Laser and Integrated Circuit, Yasuharu Suematsu (ed.), Ohmsha Ltd, 1984, pp. 443, FIG. 15.23".

The wavelength of exposure light, in this instance, is set so as not to be absorbed either by the second photoresist 28 or the third photoresist 29. Phase-shift structures are formed in places where the gap of two tiers from the layers of the second photoresist 28 and the third photoresist 29 appears. The magnitude of phase shifts can be controlled by the thickness of respective photoresist film above. The signs of phase shifts are determined by the direction of the photoresist pattern ends to the interference exposure light. In FIG. 6(6) right side ends (a) give negative signs, and left side ends (b) give positive signs.

Next, as illustrated in FIG. 6(7), the second photoresist 28 and the third photoresist 29 are completely removed and the first photoresist 27 is developed to form a grating pattern.

As illustrated in FIG. 6(8), the semiconductor substrate 13 is then etched, using the first photoresist 27 as a mask, and hereby a grating pattern 30 is formed on the semiconductor substrate 13. Then, the substrate 13 is divided, for example, between the phase shift with $-1/3.02$ period and that with $1/3.02$ period.

On such a semiconductor substrate whereon the grating pattern is formed as described above, a multi-wavelength semiconductor laser array 22 of the third embodiment can be manufactured by applying a known method of epitaxial growth as well as a known method for fabricating an electrode pattern.

In addition, anti-reflection coating is given to both ends of all of these four semiconductor lasers 23–26.

Figure 7:
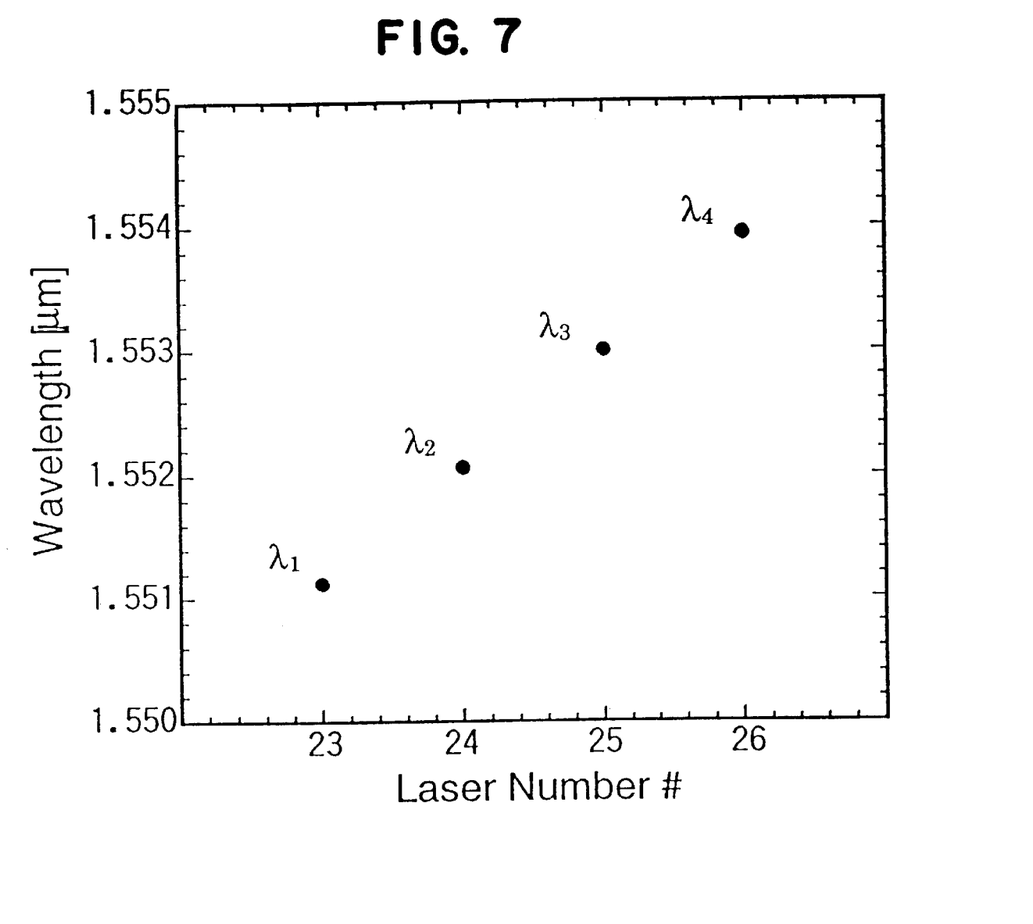
FIG. 7 is a diagram showing the oscillation wavelengths of the four-wavelength semiconductor laser array of the third embodiment.

FIG. 7 is a diagram showing the oscillation wavelengths of the four-wavelength semiconductor laser array 22, according to this embodiment. It should be noted that although the grating periodicity in each semiconductor laser is all the same, different oscillation wavelength is obtained from each, resulting from having different phase-shift regions in each semiconductor laser. Hereupon the difference of wavelengths between two neighbouring semiconductor lasers are equal and 0.94 nm.

While this embodiment is realized in the form of the four-wavelength semiconductor laser array by setting the phase-shift structures at three positions, the number of phase-shifts as well as the number of lasers emitting different wavelength are not limited by this, as mentioned for the above embodiments, and in like manner, although a distribution feedback coupling constant κ L is set to be 3, generally 2 to 4 is preferred.

Thus, there is provided by the present invention a multi-wavelength DFB semiconductor laser array, equipped with a plurality of semiconductor lasers on one single substrate, each of which is independently designed to have a separate oscillation wavelength, and capable of a stable wavelength operation at the time of semiconductor laser modulation.

Further provided, according to the present invention, is a multi-wavelength DFB semiconductor laser array having a shortened fabrication time for the grating equipped in each laser element and a reduced production cost, in comparison with heretofore available, and being apt for mass production, as well as a method for manufacturing thereof.

The use of the multi-wavelength DFB semiconductor laser array of the present invention, therefore, enables large capacity transmission in optical communication so that it is possible to cope with the demand for a wider communication service and an increase of subscribers, and whereupon an optical communication system for subscribers with a low cost can be realized.

What is claimed is:

1. A multi-wavelength DFB semiconductor laser array comprising a plurality of DFB semiconductor laser elements arranged side by side on a semiconductor substrate, wherein:

a grating periodicity is set equal for all of the laser elements; and phase-shift structures of the grating are placed at a plurality of positions in the cavity of each laser element, the magnitudes of the phase-shift being set independently, whereby an oscillation wavelength of each laser element is set independently.

2. The multi-wavelength DFB semiconductor laser array according to claim 1 wherein, the phase-shift structures equipped in each laser element are placed at positions dividing equally the whole length of the laser cavity and have the magnitudes of the phase shifts with the same absolute value therein.

3. The multi-wavelength DFB semiconductor laser array according to claim 2 wherein, the magnitude of the phase shifts are either ¼ or –¼ of a period of the grating.

4. The multi-wavelength DFB semiconductor laser array according to claim 3 wherein, the phase-shift structures equipped in each laser element are placed at three positions dividing equally the whole length of the laser cavity.

5. The multi-wavelength DFB semiconductor laser array according to claim 1 wherein, the phase-shift structures equipped in each laser element are placed at positions dividing equally the whole length of the laser cavity and the magnitudes of the phase shifts are set so that the difference of the wave-lengths between two neighboring semiconductor lasers are equal.

6. The multi-wavelength DFB semiconductor laser array according to claim 5 wherein, the phase-shift structures equipped in each laser element are placed at three positions dividing equally the whole length of the laser cavity.

* * * * *